United States Patent [19]

Tepman

[11] Patent Number: 5,380,414

[45] Date of Patent: Jan. 10, 1995

[54] SHIELD AND COLLIMATOR PASTING DEPOSITION CHAMBER WITH A WAFER SUPPORT PERIODICALLY USED AS AN ACCEPTOR

[75] Inventor: Avi Tepman, Cupertino, Calif.

[73] Assignee: Applied Materials, Inc., Santa Clara, Calif.

[21] Appl. No.: 75,259

[22] Filed: Jun. 11, 1993

[51] Int. Cl.[6] ............................................. C23C 14/34
[52] U.S. Cl. .......................... 204/192.3; 204/192.12; 204/298.11; 204/298.26
[58] Field of Search ..................... 204/192.11, 192.12, 204/192.3, 298.11, 298.26

[56] References Cited

U.S. PATENT DOCUMENTS

| | | | |
|---|---|---|---|
| 4,756,810 | 7/1988 | Lamont, Jr. et al. | 204/192.3 |
| 4,816,126 | 3/1989 | Kamoshida et al. | 204/192.3 |
| 4,963,239 | 10/1990 | Shimamura et al. | 204/192.12 |
| 5,178,738 | 1/1993 | Ishikawa et al. | 204/192.11 |
| 5,202,008 | 4/1993 | Talieh et al. | 204/192.32 |
| 5,232,571 | 8/1993 | Braymen | 204/192.22 |

*Primary Examiner*—Aaron Weisstuch
*Attorney, Agent, or Firm*—Thomas B. Haverstock

[57] ABSTRACT

A deposition chamber includes a target and an acceptor for supporting a wafer during a deposition cycle. The acceptor is made out of a pasting material in order that a pasting cycle can be run periodically in the deposition chamber to form a barrier between the layers of the target material to prevent the layer of target material from becoming too thick and thereby cracking and flaking. A shield protects the interior of the chamber during a deposition cycle. A collimator may be present between the target and the acceptor. A plasma is formed in the chamber and selectively attracted toward the target for deposition of target material onto a wafer or toward the acceptor for pasting acceptor material onto the shield and the bottom of the collimator, if present. A plurality of wafers are cycled through the deposition chamber for depositing the deposition material on their surface. After the plurality of wafers, a pasting cycle is run, depositing the pasting material around the interior of the shield, on the collimator and on the target. The target is then cleaned of pasting material while using a dummy wafer in the deposition chamber.

15 Claims, 2 Drawing Sheets

SHIELD AND COLLIMATOR PASTING DEPOSITION CHAMBER WITH A WAFER SUPPORT PERIODICALLY USED AS AN ACCEPTOR

FIELD OF THE INVENTION

The present invention relates to the field of physical vapor deposition of wafers. More specifically, the present invention relates to the field of physical vapor deposition of wafers in a deposition chamber.

BACKGROUND OF THE INVENTION

During the physical vapor deposition of wafers, a deposition chamber, as illustrated in FIG. 1, is used to sputter the deposition material on a wafer 4. This deposition material can be any compound which is commonly used in the physical vapor deposition of wafers. Aluminum, an alloy of aluminum, titanium, tungsten and a composite of titanium and tungsten are commonly used as deposition materials. A target 2 is formed out of the deposition material to be used and is positioned at the top of the deposition chamber. The wafer 4 is supported by a pedestal 5 and is positioned at the bottom of the deposition chamber. A shield 6 is positioned within the interior of the deposition chamber. Inside the deposition chamber, the wafer 4 rests on a pedestal 5 which is positioned at the bottom of the deposition chamber.

As is well known, a plasma of a gas, e.g., argon, is formed in the chamber. Ions from the plasma are attracted to the target by applying an appropriate voltage to the target. For example, a plasma can be formed by applying a sufficiently large DC voltage between the cathode, e.g., the target 2, and the anode, e.g., the shield 6. By applying the negative terminal of the voltage supply to the target 2, the ions in the plasma will be attracted to the target 2 as the plasma is formed.

As the plasma ions strike the target 2, particles are sputtered from the surface of the target 2 at a significant kinetic energy. Because of the amount of kinetic energy imparted to the particles escaping from the target 2, the particles will typically adhere securely to any solid structure which they strike, including the interior surface of the shield 6.

A magnetron 1 can be used to shape the plasma and the flow of ions to the target 2. The magnetron 1 can be one or more permanent magnets or electro-magnets of appropriate strength, orientation, and position to achieve the desired shaping. Additionally, the magnetron can be moved during a deposition process, e.g., by a motor to provide uniform plasma flow to the target.

In this deposition chamber it is also possible to conduct reactive sputtering using more than one element to make up the deposition material. To conduct reactive sputtering and deposit a compound consisting of more than one element on the wafer 4, a gas of the second element is introduced into the deposition chamber inside the area enclosed by the shield 6. The first element is still obtained from the target 2 as described above. As the sputtered particles from the target 2 are travelling away from the target 2, they react with the gas particles on their way to the wafer 4 forming a reactive compound which is then deposited on the wafer 4.

Most of the reactive compounds used for reactive sputtering cannot exist in thick layers on an object without breaking up or flaking. For example, compounds such as titanium nitride are commonly used in reactive sputtering, are high stress materials and can only exist in very thin layers without breaking up or flaking. When the layers of these types of reactive compounds become too thick they tend to crack and break apart introducing extraneous and unwanted particles into the deposition chamber.

After the deposition of multiple wafers, the layer of the reactive deposition compound becomes thick on the interior walls of the shield 6. This reactive compound layer will then begin to flake and crack, introducing extraneous particles within the interior of the shield 6. These particles will damage the deposition of future wafers and will detract from the purity of the layer deposited on the surface of the wafer 4.

Because of the particles created from the flaking of thick layers of reactive compounds it is necessary to replace the shield 6 periodically. The deposition chamber cannot be used during the time that the shield 6 is being replaced, costing the owner valuable production throughput time and the cost of the new shield can also be expensive.

A different but related problem results when a collimator 3 is positioned between the target 2 and the wafer 4 inside of the deposition chamber (FIG. 3). The collimator 3 filters the moving particles of the target material so that only particles traveling within a predetermined range of angles can strike the wafer. The collimator 3 has holes 7 which extend through its depth, allowing the particles sputtered from the target 2 to pass through the collimator 3 if they are projected through a hole 7. During deposition the particles sputtered from the target 2 travel through the holes 7 and are deposited on the wafer 4. The collimator 3 also has a surface 8 between each of the holes 7 and the interior sidewalls 9 of the holes. The ratio of the depth of the holes 7 to the diameter of the holes 7 is called the aspect ratio. Some of the particles sputtered from the target 2 will be deposited on top of the surface 8 and on the interior sidewalls 9 of the holes 7 as well as on the interior surface of the shield 6.

After a vacuum is formed, a partial pressure of argon gas is formed in the chamber to aid in the formation of plasma. The partial pressure is typically in the range of 0.5–20 mTorr of the gas, e.g., argon. During a reactive deposition nitrogen gas will also be introduced into the chamber to react with the target material being deposited. As illustrated in FIG. 4, at least a portion of the particles of target material will strike a gas molecule or a plasma ion after such a particle passes through the collimator 3. Occasionally, a particle of target material 12 will ricochet from the gas molecule 14 or ion while losing much of its kinetic energy to the gas molecule as shown in FIG. 4. At least a portion of these slow moving particles will adhere loosely to the underside of the collimator. A layer formed from such slow moving particles is likely to flake more readily than even those on the shield.

What is needed is an apparatus and method which will allow the shield and collimator to be used for a longer period of time in the deposition of reactive compounds without creating flakes and extraneous particles inside of the deposition chamber.

SUMMARY OF THE INVENTION

A deposition chamber is provided which allows the shield and/or collimator to be used for longer periods of time without flaking or forming particles while requiring less frequent replacement periods. A primary apparatus is provided for depositing a target material onto a object such as a semiconductor wafer. The apparatus for depositing a target material includes a source having a target, means for generating a plasma, and means for attracting the ions in the plasma to the target so that particles of the target are sputtered and deposited on the surface of the wafer. The apparatus may include a primary magnetron to shape the plasma and the flow of ions to the target.

A second apparatus is provided for depositing a pasting material over the interior of the deposition chamber. The apparatus for depositing a pasting material onto the shields and the bottom of the collimator, if present, includes an acceptor as the pasting target, means for generating a plasma, and means for attracting the ions in the plasma to the acceptor so that particles of the acceptor are sputtered and deposited on the shield and collimator, if present. The apparatus may include a secondary magnetron to shape the plasma and the flow of ions to the acceptor.

The target is positioned above the acceptor. A first DC voltage supply has its positive terminal coupled to the shield and its negative terminal coupled to the target for depositing target material. A second DC voltage supply has its positive terminal coupled to the shield and its negative terminal coupled to the acceptor for pasting. A single DC voltage supply may be used and appropriately switched between depositing target material and pasting.

The primary magnetron is positioned above the target, and the secondary magnetron is positioned below the acceptor. A collimator may be present and positioned between the target and the acceptor.

The deposition material can be a reactive compound formed from a first element obtained from the target and a second element obtained from a gas introduced into the deposition chamber. The target is cleaned after a pasting operation by running a deposition cycle and depositing onto a dummy wafer to clean any acceptor material that was deposited onto the target.

A method of avoiding flaking of the build-up of high stress material on inner walls of a deposition chamber includes the steps of: depositing a target material or a compound of the target material onto the surface of a plurality of wafers, preferably one at a time; depositing a pasting compound on the surface of a target and on the interior of the deposition chamber with no wafer in the deposition chamber; cycling a dummy wafer through the deposition chamber for cleaning the target; and repeating the above steps. The step of depositing is performed by bombarding a target with ions. The step of depositing a pasting compound is performed by bombarding an acceptor with ions. The target is cleaned after a pasting cycle by bombarding it with ions causing the pasting material to be sputtered from the target. The compound can be a reactive compound formed by two elements, the first element obtained from bombarding a target with ions causing pieces of the target to be sputtered and the second element obtained by introducing a gas into the deposition chamber, the first and second elements reacting and forming the reactive compound which is then deposited onto the surface of the wafer.

DETAILED DESCRIPTION OF THE PREFERRED EMBODIMENT

Figure 1:
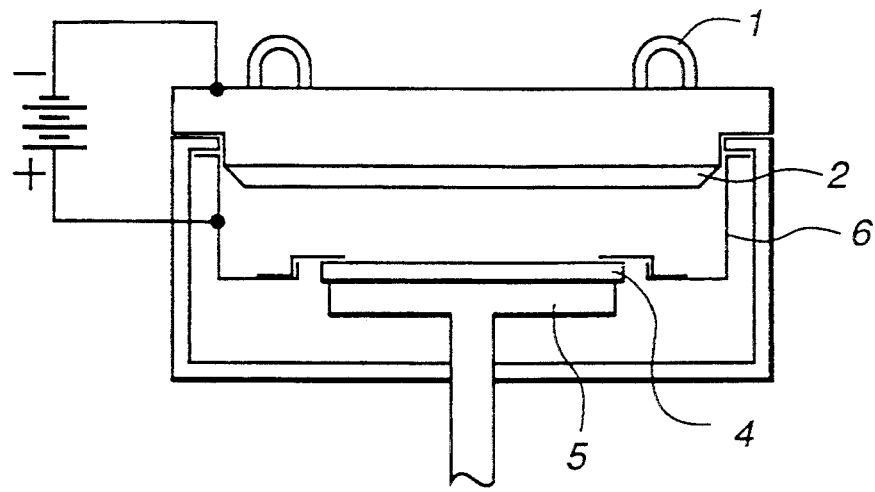
FIG. 1 illustrates a deposition chamber of the prior art.
Figure 2:
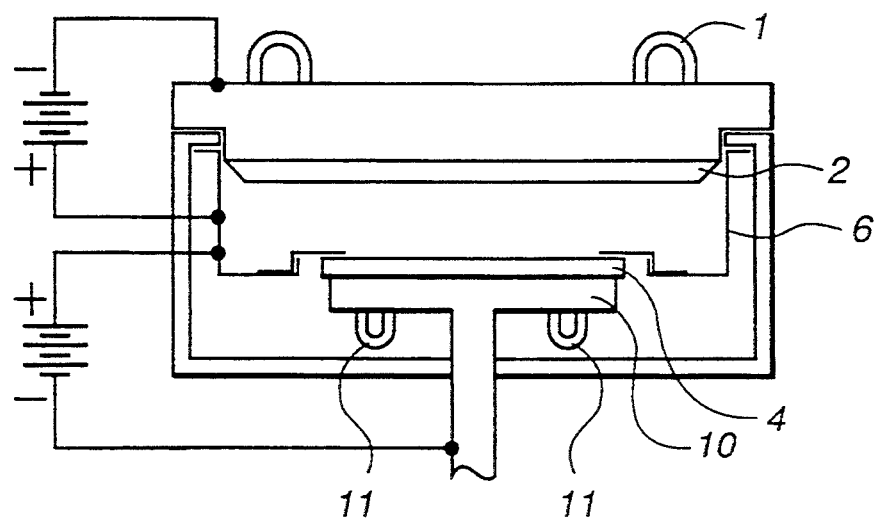
FIG. 2 illustrates a deposition chamber of the present invention with a secondary magnetron and an acceptor for a pedestal.
Figure 3:
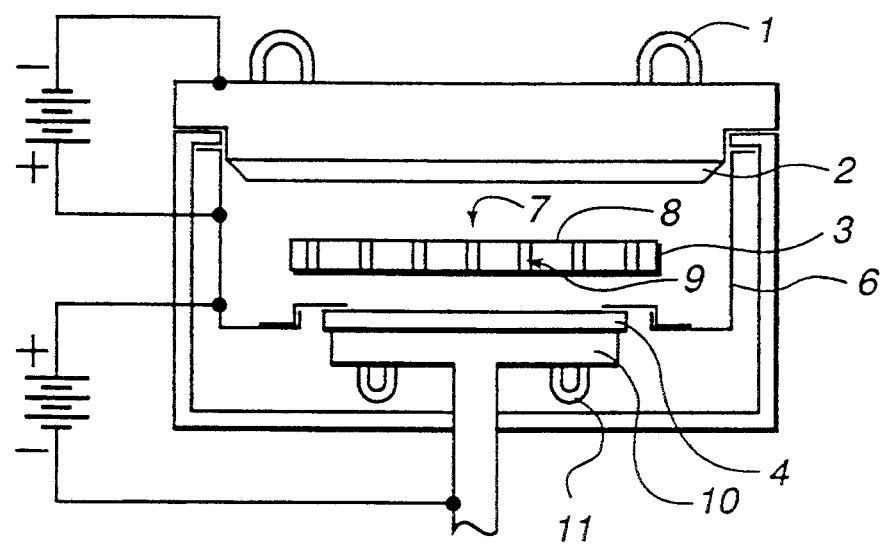
FIG. 3 is a cross sectional representation of a deposition chamber of the present invention including a collimator.

A deposition chamber of the present invention is illustrated in FIG. 2. The chamber includes a sputtering source having a target 2. The interior of the chamber is protected by a shield 6. An acceptor 10 is positioned at the bottom of the chamber for supporting a wafer during a deposition cycle. The acceptor 10 is made out of a pasting material such as aluminum or titanium which will not crack or flake when deposited in thick layers and which will readily adhere to another deposition material when deposited on top of it. The apparatus may include a primary magnetron 1 to shape the plasma and the flow of ions to the target.

During a deposition cycle, the chamber is evacuated of air and a partial pressure of argon gas is introduced. A plasma is formed of the argon by applying a DC voltage between the shield 6 and the source wherein the negative terminal is coupled to the target 2. This electrical coupling also acts to attract the ions of the plasma to the target for sputtering.

A plurality of wafers 4 are cycled through the deposition chamber of the present invention, serially. As the wafers 4 are cycled through the deposition process, sputtering is conducted of the target material which is deposited on the surface of each wafer 4. The material is also deposited on the interior of the shield 6 and, if present, on the underside of the collimator 3.

As the deposited material becomes thick it can flake. If the material is a high stress material, or if the material is deposited on the underside of the collimator 3, if present, it is prone to crack and flake. To prevent cracking and flaking of this deposited material inside the deposition chamber, a layer of pasting material which is cracking and flaking resistant is periodically deposited over the interior of the shield 6 and on the collimator 3, in order that the layer of high stress material will not be allowed to become thick enough to crack or flake.

Figure 4:
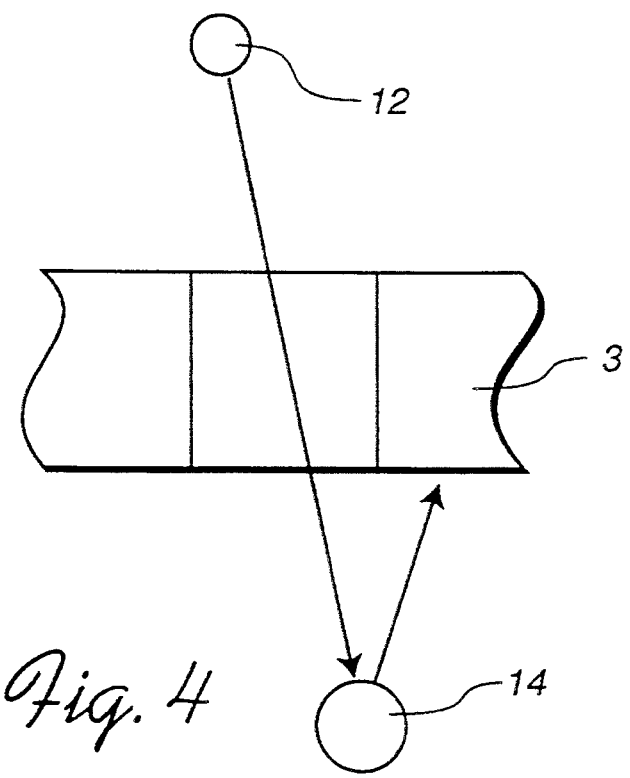
FIG. 4 illustrates a ricocheting target material particle.

The pasting material is obtained from the acceptor 10 and is sputtered onto the interior of the shield and over the collimator, if present, and over the target by forming a plasma and attracting ions to bombard the acceptor 10 with an appropriately coupled DC voltage supply. The ions which bombard the acceptor 10 cause particles of the pasting material to be sputtered away from the acceptor 10 and towards the interior of the shield 6 and unavoidably toward the target 2. This is done while there is no wafer 4 in the deposition chamber to impede the sputtering of the pasting material from the acceptor 10. If a collimator 3 is present (FIG. 4) the underside of the collimator 3 will also receive a layer of deposited acceptor material. The apparatus may include a secondary magnetron 11 to shape the plasma and the flow of ions to the acceptor 10.

After the pasting material has been sputtered around the interior of the shield 6, the target now includes a layer of the pasting material. This must be removed before a wafer may be cycled through the deposition chamber to avoid contaminating the wafer with pasting material. A dummy wafer is cycled through the deposition chamber and DC voltage is applied to form a plasma and attract ions to the target 2 to sputter clean the pasting material from the target 2.

The layer of pasting material deposited onto the interior of the shield 6 and on the collimator 3 will form a barrier to cracking and flaking between the layers of the high stress material. This barrier will not allow the individual layers of the high stress material to become thick enough that they can crack or flake. By depositing this barrier layer of pasting material, the thickness of the layers of the high stress material inside the deposition chamber can be controlled and the lifetime of the shield and collimator can be extended.

The acceptor 10 will require replacement periodically as the pasting material is depleted by the pasting of the interior of the shield 6. Because the target 2 must also be replaced periodically, it will be efficient to replace both the acceptor 10 and the target 2 at the same time. The equipment operator may also find it efficient to change the shields and/or collimator as the target 2 and acceptor 10 are replaced.

The secondary magnetron 11 can be coupled to the base of the acceptor 10, it can be stored in the bottom of the deposition chamber and brought up to the acceptor 10 during the pasting cycle, or it can be brought from outside of the deposition chamber and positioned under the acceptor 10 during the pasting cycle.

During a deposition process using the present invention, a plurality of wafers are cycled through the deposition chamber and the deposition material is deposited on the surface of the wafers 4. After this plurality of wafers have cycled through the deposition chamber a pasting cycle is performed in the deposition chamber with no wafer present. During this pasting cycle the DC power is turned off to the target 2 and the power to the acceptor 10 is turned on, depositing the pasting material from the acceptor 10 around the interior of the shield 6, on the collimator 3 and on the surface of the target 2. The power to the acceptor 10 is then turned off, a dummy wafer is brought into the deposition chamber and positioned on the acceptor 10, and the power to the target 2 is turned back on. The target is then cleaned and the pasting material from the target is re-sputtered around the interior of the shield 6, on the collimator 3 and on the dummy wafer. Another plurality of wafers are then cycled through the deposition chamber. Though the preferred sputtering process includes DC power applied selectively to the target and acceptor, the invention is not so limited and can be applied to other PVD deposition processes.

This process will deposit a layer of pasting material between thin layers of the reactive compound so that the high stress material will not accumulate into thick layers which will crack or flake and introduce unwanted particles into the deposition chamber. In the preferred embodiment of the present invention a pasting cycle is performed periodically, generally after a predetermined number of wafers have received a deposition of target material.

It will be apparent to one of ordinary skill in the art that various modifications may be made to the preferred embodiment without departing from the spirit and scope of the invention as defined by the appended claims.

I claim:

1. An apparatus comprising a deposition chamber having a target of deposition material for use in physical vapor deposition onto a wafer that is adapted to be supported within the chamber on a wafer acceptor positioned below the target, the chamber comprising:
   a. means for bombarding the target with ions for sputtering the deposition material; and
   b. means for bombarding the wafer acceptor with ions for sputtering the material of the wafer acceptor, wherein the wafer acceptor is formed of a different material than the deposition material.

2. The apparatus according to claim 1 wherein the means for bombarding the target with ions comprises:
   a. means for evacuating air from the chamber;
   b. means for introducing a partial pressure of a gas into the chamber;
   c. means for forming a plasma of the gas; and
   d. means for attracting ions from the plasma to the target to sputter the deposition material.

3. The apparatus according to claim 2 further comprising a magnetron positioned above the target for shaping the plasma and a flow of ions to the target.

4. The apparatus according to claim 1 wherein the means for bombarding the wafer acceptor with ions comprises:
   a. means for evacuating air from the chamber;
   b. means for introducing a partial pressure of a gas into the chamber;
   c. means for forming a plasma of the gas; and
   d. means for attracting ions from the plasma to the wafer acceptor to sputter the acceptor.

5. The apparatus according to claim 4 further comprising a magnetron positioned below the wafer acceptor for shaping the plasma and a flow of ions to the wafer acceptor.

6. The apparatus as claimed in claim 5 further comprising means for removing deposited acceptor material from the target, including:
   a. means for evacuating air from the chamber;
   b. means for introducing a partial pressure of a gas into the chamber;
   c. means for forming a plasma of the gas; and
   d. means for attracting ions from the plasma to the target to sputter the wafer acceptor material.

7. The apparatus according to claim 1 wherein the deposition material is a reactive compound formed from a first element obtained from the target and a second element obtained from a second gas introduced into the deposition chamber.

8. The apparatus as claimed in claim 1 further comprising a collimator positioned between the target and the acceptor.

9. A method to be used in the physical vapor deposition onto a plurality of wafers inside of a deposition chamber having a target positioned near the top of the chamber and a wafer acceptor positioned near the bottom of the chamber for supporting a wafer during a deposition cycle, the method comprising the steps of:
   a. bombarding the target with ions for depositing material from the target onto a predetermined number of wafers sequentially; and
   b. periodically bombarding the wafer acceptor with ions for depositing material from the wafer acceptor onto the interior surfaces of the deposition chamber, wherein this step is performed with no wafer in the deposition chamber, and further wherein the target and the wafer acceptor are formed of different types of material.

10. The method according to claim 9 further comprising cleaning the target after the step of periodically bombarding the wafer acceptor comprising the step of placing a dummy wafer on the wafer acceptor and bombarding the target for depositing the contaminate onto the wafer and cleaning the target thereby.

11. The method according to claim 9 further comprising repeating steps a–b.

12. The method according to claim 9 wherein the material from the target combines with a gas to form a reactive compound.

13. A physical vapor deposition device for use in depositing material onto a surface of a wafer, comprising:
   a. a deposition chamber having an interior space;
   b. a shield mounted within the chamber for protecting the interior surfaces of the chamber;
   c. a wafer acceptor comprising a pasting material positioned at a bottom portion of the chamber for supporting a wafer;
   d. a target comprising a deposition material that is different from the pasting material positioned above the wafer acceptor and coupled to the shield of the deposition chamber;
   e. means for forming a plasma within the chamber; and
   f. means for selectively attracting ions from the plasma to either the target for forming sputtered target material or to the wafer acceptor for forming sputtered acceptor material.

14. The device according to claim 13 further comprising a collimator positioned between the target and the wafer acceptor, the collimator for collimating the sputtered target material before it is deposited onto the surface of the wafer.

15. The device according to claim 14 further comprising means for reactively combining the sputtered target material with a gas that has been introduced into the chamber.

* * * * *